United States Patent
Yano et al.

[11] Patent Number: 6,046,499
[45] Date of Patent: *Apr. 4, 2000

[54] HEAT TRANSFER CONFIGURATION FOR A SEMICONDUCTOR DEVICE

[75] Inventors: Keiichi Yano; Hironori Asai, both of Tokyo, Japan

[73] Assignee: Kabushiki Kaisha Toshiba, Kanagawa-ken, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/824,844

[22] Filed: Mar. 26, 1997

[30] Foreign Application Priority Data

Mar. 27, 1996 [JP] Japan .................. 8-072275
Mar. 27, 1996 [JP] Japan .................. 8-072592

[51] Int. Cl.⁷ ............... H01L 23/34; H01L 23/48
[52] U.S. Cl. .......... 257/712; 257/693; 257/720; 257/737; 257/738; 257/778; 257/779; 257/780
[58] Field of Search .................. 257/697, 712, 257/720, 738, 778, 780, 737, 779, 693; 438/612, 613, 106

[56] References Cited

U.S. PATENT DOCUMENTS

| | | | |
|---|---|---|---|
| 5,216,278 | 6/1993 | Lin et al. | 257/688 |
| 5,239,198 | 8/1993 | Lin et al. | 257/693 |
| 5,272,375 | 12/1993 | Belopolsky | 257/717 |
| 5,285,352 | 2/1994 | Pastore et al. | 257/712 |
| 5,311,059 | 5/1994 | Banerji et al. | 257/697 |
| 5,397,917 | 3/1995 | Ommen et al. | 257/712 |
| 5,455,456 | 10/1995 | Newman | 257/697 |
| 5,468,995 | 11/1995 | Higgins, III | 257/697 |
| 5,506,755 | 4/1996 | Miyagi et al. | 257/712 |
| 5,508,556 | 4/1996 | Lin | 257/691 |
| 5,561,322 | 10/1996 | Wilson et al. | 257/720 |
| 5,581,122 | 12/1996 | Chao et al. | 257/738 |
| 5,598,036 | 1/1997 | Ho | 257/738 |
| 5,640,048 | 6/1997 | Selna | 257/780 |
| 5,698,896 | 12/1997 | Komatsu et al. | 257/705 |
| 5,703,397 | 12/1997 | Endo et al. | 257/701 |
| 5,729,432 | 3/1998 | Shim et al. | 361/690 |
| 5,834,848 | 11/1998 | Iwasaki | 257/778 |
| 5,907,187 | 5/1999 | Koiwa et al. | 257/737 |
| 5,909,058 | 6/1999 | Yano et al. | 257/712 |
| 5,909,633 | 6/1999 | Haji et al. | 438/612 |

Primary Examiner—Olik Chauduri
Assistant Examiner—Alonzo Chambliss
Attorney, Agent, or Firm—Finnegan, Henderson, Farabow, Garrett & Dunner, L.L.P.

[57] ABSTRACT

Disclosed is a semiconductor package having: a semiconductor chip; a package substrate; a wire connected to the semiconductor chip; and an electric connection member formed on the package substrate to electrically connect the wire to a printed board when the package substrate is mounted on the printed board. One surface of the package substrate has a first area in which the semiconductor chip is mounted and a second area in which the wire are arranged, and the other surface has a third area which is located in the rear of the second area and in which the electric connection member connects the wire to the printed board and a fourth area which is located in the rear of the first area. A heat-transfer member is provided in the fourth area and transmits heat generated by the semiconductor chip to the printed board through the package substrate.

20 Claims, 4 Drawing Sheets

HEAT TRANSFER CONFIGURATION FOR A SEMICONDUCTOR DEVICE

BACKGROUND OF THE INVENTION

1. Field of the Invention

The present invention relates to a BGA (Ball Grid Array) type semiconductor package and semiconductor device.

2. Description of the Prior Art

Semiconductor chips such as LSIs are used in various electric/electronic apparatuses, e.g., computer apparatuses such as personal computers, portable electronic apparatuses including portable telephones, office home electric products such as printers, television sets, video cassette recorders. In use of a semiconductor chip, the semiconductor chip is packaged and then mounted on a printed board to constitute a semiconductor device, thereby being incorporated in the various apparatuses. The electric connection between the semiconductor device and the apparatus incorporated therewith is performed with pins which are conventionally arranged on the semiconductor device as input/output terminals.

However, with an increase in integration density of a recent LSI, a package on which the LSI is mounted must be decreased in size with an increase in number of pins and a decrease in pin pitch. Accordingly, the type of packaging has shifted from the above conventional pin insertion type to a surface mounting type such as a QFP (Quad Flat Package) type or an SM-PGA (Surface Mount type-Pin grid Array).

However, in these surface mounting type packages using pins and leads, the lower limit of a terminal pitch is high. For example, a pitch lower than 1.27 mm cannot be easily obtained in the PGA type package, and a pitch lower than 0.3 mm cannot be easily obtained in the QFP type package. Further, when a high-speed signal is to be processed, a large inductance component is generated at pin and lead portions. For this reason, a signal is disadvantageously reflected at a high frequency, and an increase in delay disadvantageously occurs.

In order to solve the above problem, a BGA (Ball Grid Array) type package is proposed. The BGA type package has the following characteristic feature. That is, a bump is formed with a solder ball or the like at an input/output portion of a package substrate, and the bump is melted to connect the input/output portion of the package to a terminal of a printed board. According to this package, a pitch which is narrower than that of a package using pins or leads can be achieved. Therefore, an increase in number of pins and a decrease in size can be achieved.

Figure 1:
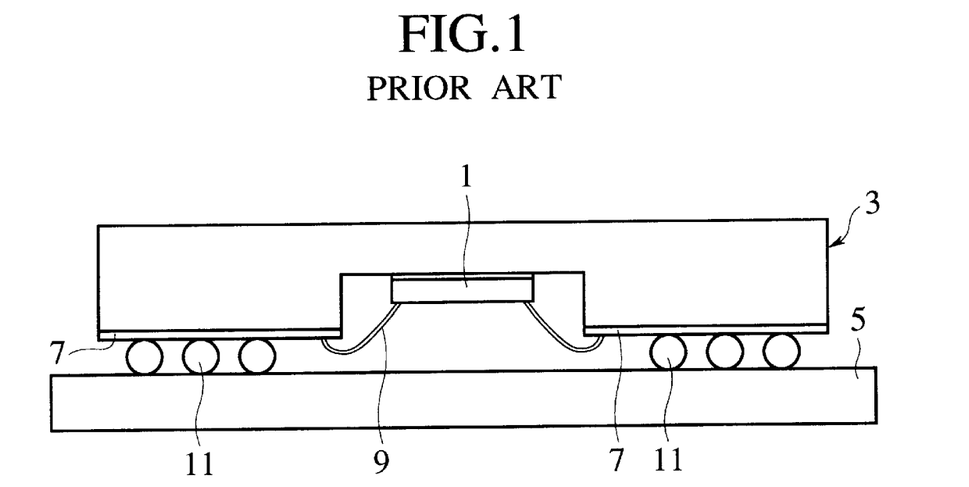
FIG. 1 is a schematic view showing the arrangement of a conventional BGA type semiconductor package and a conventional semiconductor device.

A conventional BGA type package, as shown in FIG. 1, has a cavity-down structure in which a cavity used for mounting a semiconductor chip 1 on a package substrate 3 faces a printed board 5, and the electric connection between the package substrate 3 and the printed board 5 is arranged on the same side as that of the cavity of the package substrate 3. A wiring pattern 7 is formed around the cavity of the package substrate 3. The semiconductor chip 1 and the wiring pattern 7 are connected to each other with bonding wires 9, and the wiring pattern 7 and the printed board 5 are connected to each other with solder balls 11.

In recent years, increasing of a frequency as one manner of obtaining a high-speed and high-performance electronic apparatus tends to further advance, and the operation frequency of a semiconductor element also increases. Since such a high-frequency semiconductor element has a high output, a countermeasure against an increase in heat generation with the high output is a problem. As a result, improvement of heat radiation properties must be achieved even in a BGA type package.

In the BGA type package as shown in FIG. 1, when heat generated by the semiconductor chip is radiated toward the printed board, the heat is transmitted through the package substrate and the solder balls to the printed board. However, such a long heat-transfer path has a high thermal resistance. Therefore, the BGA package cannot sufficiently cope with an increase in heat generation of the semiconductor element described above, and the heat radiation properties must be therefore improved.

In addition, when the semiconductor package is considered as a whole, the resistance of the wires arranged on the package substrate also serves as a heat generator, and the resistance of the wires must be decreased to reduce the heat generation. In order to decrease the resistance of wires, it is necessary to make the wires short, to make large the sectional area (i.e., the diameter or the thickness) of each wire, or to form the wires with a low-resistance material. However, in order to use shorter wires, a technique for forming finer wires must be developed, and this causes a disadvantageous increase of manufacturing costs. Use of a thick wire is improper for a high-density wiring structure, and makes it difficult to print a fine wiring pattern. In many cases, the thick wire is a disadvantage.

SUMMARY OF THE INVENTION

In order to solve the above problems, it is an object of the present invention to provide a semiconductor package and a semiconductor device whose radiation properties are improved and which can cope with high heat generation caused by an increase in speed and an increase in integration density.

It is another object of the present invention to provide a semiconductor package and a semiconductor device which can reduce heat generation, which can withstand a high integration density, and which can be used at a high frequency.

It is still another object of the present invention to provide a semiconductor package and a semiconductor device having excellent electric characteristics which can cope with signal processing performed at a high speed and a high frequency.

The semiconductor package according to the present invention comprises: a semiconductor chip; a package substrate on which the semiconductor chip mounted; a wire formed on the package substrate and connected to the semiconductor chip; an electric connection member formed on the package substrate to electrically connect the wire to a printed board when the package substrate is mounted on the printed board, wherein one surface of the package substrate has a first area in which the semiconductor chip is mounted and a second area in which the wire are arranged, and the other surface of the package substrate has a third area which is located in the rear of the second area and in which the electric connection member connects the wire to the printed board and a fourth area which is located in the rear of the first area, and wherein a heat-transfer member for transmitting heat generated by the semiconductor chip to the printed board through the package substrate is provided in the fourth area.

The heat-transfer member is electrically disconnected from the semiconductor chip and the wire.

The heat-transfer member includes a plurality of spherical ball which is made of a low-melting-point alloy.

The low-melting-point alloy is selected from the group consisting of tin-lead alloy, tin-zinc alloy, tin-silver alloy, tin-copper alloy and tin-bithmus alloy.

The electric connection member includes a bump which is formed in the third area on the other surface of the package substrate and a via which penetrates the package substrate to connect the wire and the bump.

The electric connection member includes a spherical ball which is made of a low-melting-point alloy.

The package substrate is composed of a material which is selected from the group consisting of aluminum nitride and silicon nitride.

The wire is formed by using copper.

Moreover, the semiconductor device according to the present invention is produced by mounting the semiconductor package described above, on the printed board.

The features and advantages of the semiconductor package and a semiconductor device according to the present invention over the proposed package and device will be more clearly understood from the following description of the preferred embodiments of the present invention taken in conjunction with the accompanying drawings.

BRIEF DESCRIPTION OF THE DRAWINGS

In the accompanying drawings, like reference numerals designate the same or similar elements or sections throughout the figures thereof and in which.

DETAILED DESCRIPTION OF THE PREFERRED EMBODIMENTS

Processing for heat generation of a semiconductor chip which increases with an increase in operation speed and an increase in number of functions of an electric/electronic apparatus is important to stably operate the semiconductor chip. In the BGA type package as shown in FIG. 1, heat generated by a semiconductor chip 1 may be radiated upward through a package substrate 3 covering the semiconductor chip 1. Therefore, it is proposed to arrange a heat radiation device such as a fin. However, a device such as a fin which occupies a large space is disadvantageously arranged on a semiconductor package and a semiconductor device which are used in an electric/electronic apparatus in which decreases in size and weight are important, and the arrangement of the fin must be avoided as hard as possible. In such a situation, according to the present invention, it is proposed that heat generated by a semiconductor chip is efficiently radiated to a printed board, and it is also proposed to provide the arrangement of the semiconductor package and a semiconductor device comprising the semiconductor package which can efficiently radiate heat to the printed board.

In order to enhance heat radiation from the package substrate to the printed board, a heat-transfer member for connecting the package substrate to the printed board is arranged. However, in the package having the cavity down structure shown in FIG. 1, a space for arranging the heat-transfer member cannot be obtained. Therefore, in the semiconductor package of the present invention and a semiconductor device in which the semiconductor package is arranged on a printed board, the semiconductor chip 1 has a structure in which the semiconductor chip 1 is mounted not on the lower surface but on the upper surface of a package substrate 13 opposing the surface connected to a printed board 15.

A semiconductor package and a semiconductor device according to an embodiment of the present invention will be described below with reference to FIG. 2 in detail. A semiconductor chip 1 is fixed with an adhesive on a central portion 17a of an upper surface 17 of the package substrate 13 which is composed of ceramic, and wires 19 are formed on a peripheral portion 17b of the upper surface 17. The semiconductor chip 1 is connected to the wires 19 with bonding wires 21. The bonding wires 21 and the semiconductor chip 1 are sealed by using a sealing resin 23. Bumps 27 made of solder balls are arranged at a peripheral portion 25a of a lower surface 25 of the package substrate 13 in correspondence with the wires 19, and heat-transfer members 29 are arranged on the central portion 25a of the lower surface 25. In this embodiment, solder balls are used as the heat-transfer members 29. Vias 31 are formed in the substrate to penetrate the package substrate 13 perpendicularly to the surface of the package substrate 13, and the vias 31 are connected to the wires 19 and the bumps 27. The bumps 27 and the heat-transfer members 29 of a semiconductor package 32 arranged as described above are connected to the printed board 15 to form a semiconductor device 32'. For connection between the bumps 27 and the package substrate 13 and the printed board 15 and connection between the heat-transfer members 29 and the package substrate 13 and the printed board 15, a proper pad (not shown) can be used as needed.

In the above arrangement, the semiconductor chip 1 and the printed board 15 are electrically connected to each other by the bonding wires 21, the wires 19, the vias 31, and the bumps 27. Heat generated by operation of the semiconductor chip 1 is downwardly transferred to the central portion of the package substrate 13, and is radiated to the printed board 15 through the heat-transfer members 29. The heat-transfer members 29 transfer heat between the package substrate 13 and the printed board 15, and have a function of reinforcing the mechanical coupling between the package substrate 13 and the printed board 15. However, the heat-transfer members 29 do not concern the electric connection between the package substrate 13 and the printed board 15.

Figure 2:
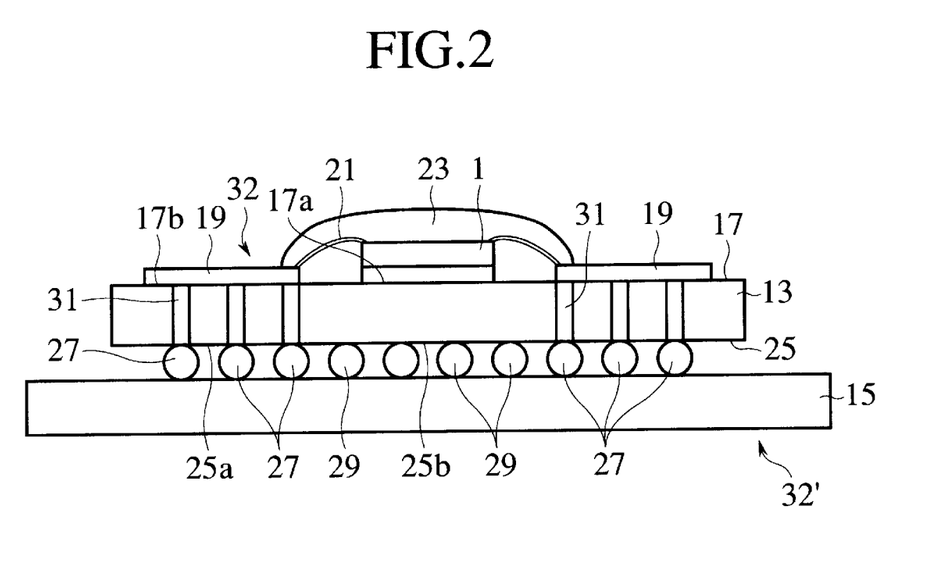
FIG. 2 is a schematic view showing the arrangement of a semiconductor package and a semiconductor device according to the first embodiment of the present invention.
Figure 3:
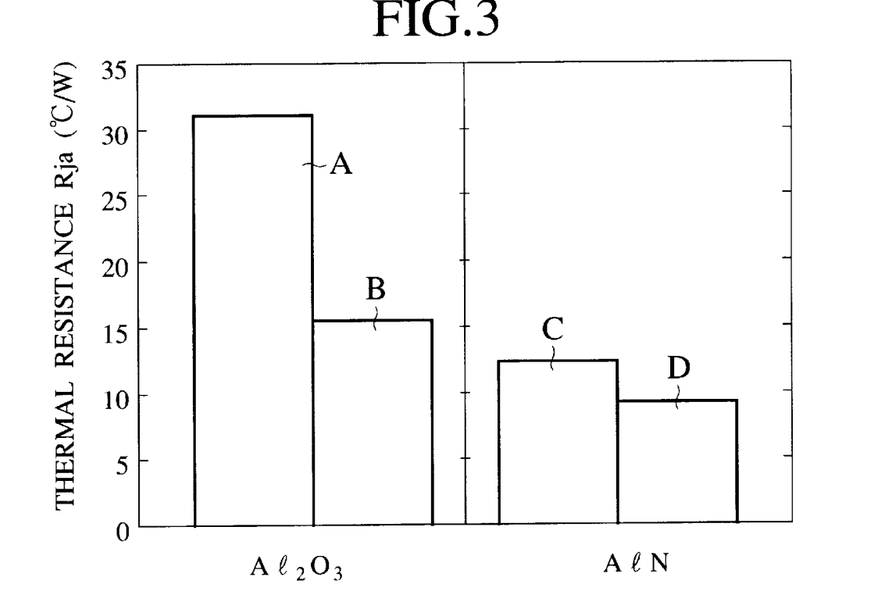
FIG. 3 is a graph showing the thermal resistance's of semiconductor packages (A and C) having heat-transfer members and the thermal resistance's of semiconductor packages (B and D) having no heat-transfer members, in which A and B indicate cases using an alumina substrate and C and D indicate cases using aluminum nitride.

The effect of the heat-transfer members 29 in the arrangement of the semiconductor device 32' in FIG. 2 can be easily understood by FIG. 3. FIG. 3 shows results obtained by calculating thermal resistance, Rja, (increases in temperature per an output), of the semiconductor package having the arrangement in which the heat-transfer members 29 are arranged as shown in FIG. 2, and of a semiconductor package having an arrangement in which the heat-transfer members 29 are omitted from the arrangement of FIG. 2. Reference symbols A and C indicate values in the case in which the heat-transfer members 29 are not arranged, and reference symbols B and D indicate values in the case in which the heat-transfer members 29 are arranged. Moreover, reference symbols A and B indicate cases using alumina as the package substrate 13, and reference symbols C and D indicate cases using aluminum nitride as the package substrate 13. In calculation, it is assumed that the dimensions of the package substrate are 35 mm×35 mm×0.6 mm, that the number of bumps 27 is 216, that the number of heat-transfer members (solder balls) is 448, that the material of the bumps 27 is Sn—Pb solder, that the diameter of each bump 27 and the diameter of each heat-transfer member 29 are 0.89 mm, respectively, that a land diameter is 0.9 mm, that a land pitch is 1.27 mm, and that the package substrate is connected to a printed board having dimensions of 114 mm×76 mm×1.6 mm.

As shown in FIG. 3, when the package substrate is composed of alumina, the thermal resistance, Rja, sharply decrease from 31.6° C./W to 15.7° C./W by arranging the heat-transfer members 29. When the package substrate consists of aluminum nitride, the thermal resistance's Rja decrease from 12.7° C./W to 9.5° C./W. When the heat-transfer members are arranged immediately below the semiconductor chip as described above, it is apparent that the heat radiation properties to the printed board is remarkably improved.

In the above embodiment, substantially spherical balls of solder (Sn—Pb low-melting-point alloy) are used as the heat-transfer members. That is quite advantageous to form the heat-transfer members together with the bumps at the same manufacturing step, because the heat-transfer members and the bumps can be formed by using the same solder balls.

However, the present invention should not be limited to this embodiment as a matter of course. For example, balls made of another heat-conductive material may be used. As a heat-conductive material, for example, various metals or alloys or resins in which these metal and alloys are dispersed may be used. From the viewpoint of environmental protection, a lead-free solder such as a tin-zinc (Sn—Zn) alloy, a tin-silver (Sn—Ag) alloy, a tin-copper (Sn—Cu) alloy, or an tin-bismuth (Sn—Bi) alloy may be preferably used. Since the heat-transfer members are not used for electric connection between the package substrate and the printed board, they may be also formed of an insulating material or a semiconductor material having a high heat conductivity.

As shown in FIG. 2, in the arrangement according to the present invention, the bumps 27 can be disposed vertically below the connection portions at which the wires 19 and the bonding wires 21 are connected with each other. Such a disposition cannot be achieved in the arrangement shown in FIG. 1, and the bumps 11 must be arranged at the positions which are spaced apart from the chip-side end of the wiring pattern 7 to some extent. Therefore, comparing with the semiconductor package and the semiconductor device shown in FIG. 1, an area in which the bumps 27 are arranged can be made close to the center of the package substrate on which the semiconductor chip is mounted. Therefore, in the arrangement of the present invention, the total length of the wires 19 can be shortened, and the semiconductor package and the semiconductor device can also be advantageously decreased in size. When the short wires are used, heat generated by the wires can be decreased.

Figure 4:
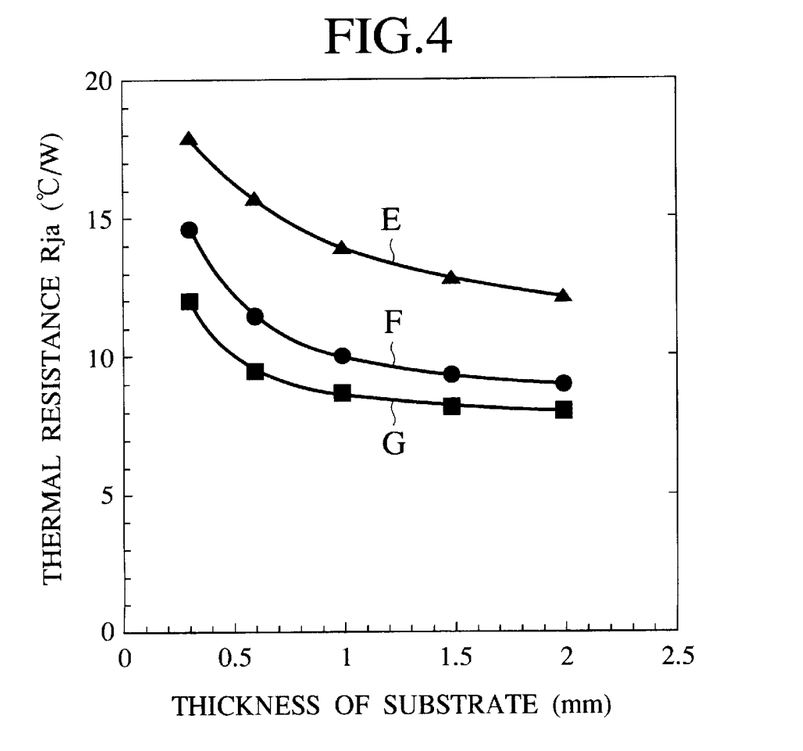
FIG. 4 is a graph showing the relationship between the thickness of a package substrate and the thermal resistance of a semiconductor package, in which E indicates a case using an alumina package; F, a case using silicon nitride package substrate; and G, an aluminum nitride package substrate.

The heat radiation properties of the semiconductor device change depending on the heat conductivity of the material constituting the package substrate, and it is preferred to use a material having a high heat conductivity for the package substrate as a matter of course. Moreover, the heat radiation properties of the semiconductor device also change depending on the thickness of the package substrate. FIG. 4 is a graph showing results obtained by calculating the thermal resistance Rja while the thickness of the package substrate 13 in the arrangement of the semiconductor device shown in FIG. 2 is changed. In FIG. 4, reference symbol E indicates a case using an alumina package substrate; F, a case using a silicon nitride package substrate; and G, a case using an aluminum nitride package substrate. As is apparent from FIG. 4, when the thickness of the package substrate decreases, the thermal resistance sharply increases. Therefore, in order to improve heat conductivity of the substrate from the semiconductor chip to the printed board, the thickness of the substrate must be increased. For this reason, it is considered that the package substrate serves as a heat sink for heat radiation. However, the thick substrate is disadvantageously used to decrease the semiconductor package and the semiconductor device in size and weight. With respect to this, as is apparent from FIG. 4, a silicon nitride or aluminum nitride package substrate can have a thickness considerably smaller than that of an alumina package substrate while keeping heat conductivity high. For example, the thermal resistance of an alumina package substrate having a thickness of 2 mm is equal to each of the thermal resistances of a silicon nitride package substrate having a thickness of about 0.5 mm and an aluminum nitride package substrate having a thickness of about 0.3 mm. In other words, the heat radiation properties of the alumina package substrate having a thickness of 2 mm can be obtained by the silicon nitride package substrate having a thickness of about 0.5 mm or the aluminum nitride package substrate having a thickness of about 0.3 mm.

The aluminum nitride also has the advantage that stress distortion generated between the package substrate and the semiconductor chip in a change in temperature is small. The reason for this is that the thermal expansion coefficient of aluminum nitride is close to that of silicon employed in the semiconductor chip, and aluminum nitride has a behavior which is caused by a change in temperature and similar to that of silicon.

The package substrate 13 of the semiconductor package and the semiconductor device shown in FIG. 2 is a single-layer substrate composed of ceramic, and the wires 19 made of copper having a low electric resistance. The package substrate 13 can be obtained in the following manner. That is, ceramic powder is compressed to form a green sheet, and the green sheet is then sintered and densified in an inert gas atmosphere to obtain a ceramic substrate. Via holes are formed in the ceramic substrate and then filled with a copper paste, and a copper thick wiring film is formed on the substrate surface by printing and then sintered at a temperature lower than the melting point (about 900° C.) of copper. As another method, via holes are formed in a green sheet for the ceramic substrate before sintering and then filled with a tungsten paste, and a copper wiring film is printed on the substrate surface after the green sheet is sintered. As still another method, a copper wiring film may be formed by electroless plating. According to these methods, wires having a fine pitch having a lead width of about 40 mm and a lead interval of about 40 mm.

The wires 19 may be formed of a metal or an alloy such as gold, silver, aluminum, or aluminum-silicon (Al—Si) alloy having a low electric resistance. As the wires 19, wires having a multi-layered structure may be used. For example, wires obtained by plating nickel and gold or copper on a pattern formed of a refractory metal such as tungsten can be used. If a copper uppermost layer is used on a tungsten layer, the resistance of wires can be decreased to about ⅕ the resistance of tungsten only. In accordance with this manner, wires having a low electric resistance and a low inductance can be formed at a low cost.

If the material for forming the vias 31 is to be filled in via holes of the substrate before sintering of the package substrate, a material which is not melted during sintering must be selected as the material for forming the vias 31. If a paste made with a low-melting-point metal such as copper is filled in the via holes before sintering, a sintering assistant or the like must be added to a raw material ceramic powder such that the package substrate can be sintered at a low temperature of about 900° C.

The bumps 27 can be formed of the lead-free solder or another low-melting-point alloy. The bumps 27 may have a multi-layered structure such that is obtained by plating gold on a copper core. The bump of a multi-layered structure in which only an outer peripheral layer is formed of a conductive material is sufficient, and a core made of a material such as a resin or ceramic may be thus incorporated in the bump for reinforcement.

The bonding wires are formed by an ordinary wire bonding method such as a supersonic wire bonding method, a thermal compression bonding method and the like. The bonding wires are formed of a metal such as a gold or aluminum, having a low electric resistance.

As the sealing resin 23, an epoxy resin, a polyimide resin, or the like can be used. In place of the sealing resin embedding the bonding wires and the semiconductor chip, a lid member made of glass or the like may be used and brazed to cover the semiconductor chip and the wires.

The embodiment can be properly applied as occasion arises. In general, a ceramic multi-layered substrate is often used as the package substrate of a BGA type semiconductor package, and the multi-layered substrate can also be applied in the embodiment shown in FIG. 2. However, the wires of the ceramic multi-layered substrate tends to be made of a metal having a relatively high electric resistance for reasons on manufacture. More specifically, in order to sinter (generally, heating at 1,800° C. to 1,900° C. must be performed) the substrate after a substrate including the wires is formed, a refractory metal such as tungsten or molybdenum must be used as the material of the wires. As a result, the electric resistance inevitably increases. With respect to this point, the embodiment in FIG. 2 is much advantaged because the electric resistance of the wires is low because of shorter wires. In addition, the embodiment in FIG. 2 is effective for the electric resistance of the via portion because the package substrate can be decreased in thickness, and heat generation can be suppressed because the vias can be shortened. Therefore, the semiconductor package and the semiconductor device according to the embodiment in FIG. 2 are excellent to decrease heat generation.

When the multi-layered substrate is used as a package substrate, wires such as power supply wires or ground wires are also formed in the substrate. If it is aimed to reduce the resistance related to those wires, each of those wires is made thick in width. In accordance with this, the inductance of the signal wires on the package substrate surface can be decreased, and a characteristic impedance can be suppressed.

Figure 5A:
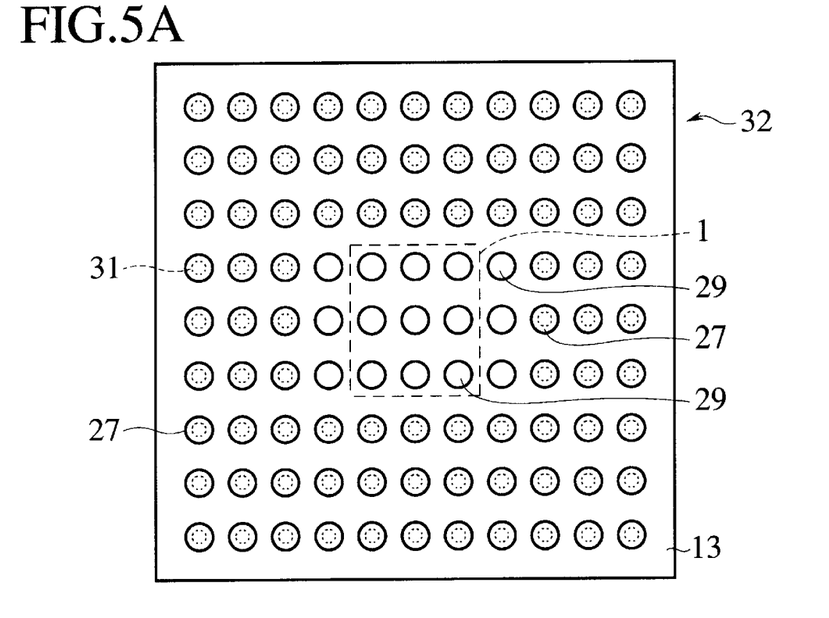
FIG. 5A is a lower view showing a semiconductor package and a semiconductor device according to the second embodiment of the present invention.
Figure 5B:
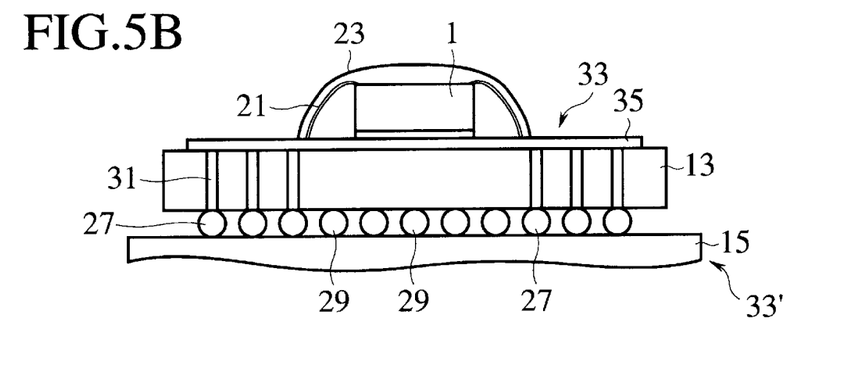
FIG. 5B is a vertical sectional view showing the semiconductor package and the semiconductor substrate in FIG. 5A.

FIGS. 5A and 5B show a semiconductor package and a semiconductor device according to another embodiment of the present invention. In the semiconductor package 33 of this embodiment, a semiconductor chip 1 is mounted on wires 35 formed on the entire surface of the package substrate 13 by using an adhesive. Bumps 27 and heat-transfer members 29 are connected to a printed board 15 to obtain a semiconductor device 33'. The remaining portions are the same as those in FIG. 2, so that the functions of the portions are the same as those in FIG. 2. Therefore, description of these portions is omitted.

Figure 6:
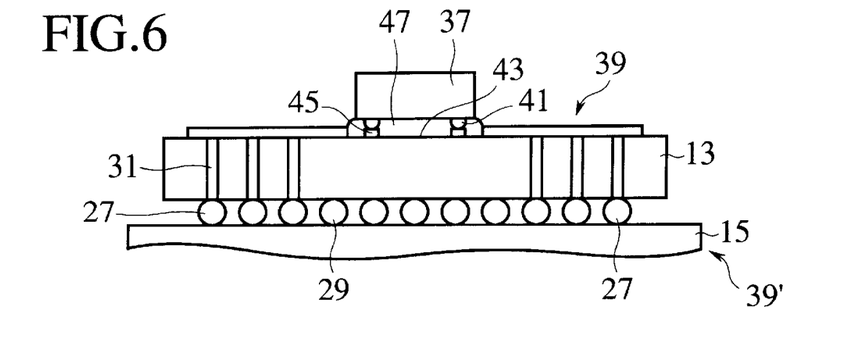
FIG. 6 is a vertical sectional view showing a semiconductor package and a semiconductor device according to the third embodiment of the present invention.

FIG. 6 shows an embodiment in which a semiconductor chip 37 is mounted on the package substrate 13 with use of flip-flop connection. In the semiconductor package 39 and the semiconductor device 39', bumps 41 are arranged on the lower surface of the semiconductor chip 37, and wiring electrodes 45 which are arranged at a central portion 43 of an upper-surface of the package substrate 13 are connected to the bumps 41 of the semiconductor chip 37. The bumps 41 and the wiring electrodes 45 are covered with a sealing resin 47.

With the arrangement of the present invention, an increase in temperature of the semiconductor device can be suppressed to about 50% of that which is obtained when a conventional BGA type package is used. Service life during which the semiconductor device can be repeatedly used is prolonged to about two times that in the conventional BGA type package, by improvement of heat radiation by means of a heat-transfer member and by reinforcement of connection between the package substrate and the printed board. It is possible to raise the operation signal frequency from 50 MHz to 1 GHz.

The semiconductor package and the semiconductor device according to the present invention are properly applied when a semiconductor device such as an MPU is formed by mounting a semiconductor chip such as a gate array, a memory, or an LSI, especially, a semiconductor chip having high-frequency elements arranged thereon. However, the present invention is not limited to the above embodiment as a matter of course.

In the present invention, since the semiconductor chip and wires are arranged on the upper surface of the package substrate, when a lid member having a heat-radiation fin formed thereon is used, heat radiation to both the upper portion of the package and the printed board can be achieved. For this reason, this arrangement is advantageous to heat radiation. Accordingly, increases in electric resistance and inductance can be suppressed. As a result, it is possible to obtain a semiconductor package and a semiconductor device which have high reliability. For this reason, the arrangement according to the present invention is very advantageous for a semiconductor package and a semiconductor device which are mounted at a high integration density.

Comparing with a case wherein wires are formed in an internal layer of a substrate, in a case wherein wires are formed on the surface of a substrate, an effective dielectric constant can be decreased, the dielectric capacity between signal wires can be decreased, and noise such as crosstalk can be reduced. Therefore, the semiconductor package and the semiconductor device obtained with the arrangement of the present invention are also excellent with respect to electric characteristics.

EXAMPLES (Sample 1)

Silicon nitride powder was compressed into a plate-like shape to form a green sheet, and the green sheet was sintered to form a package substrate having dimensions of 35 mm×35 mm and a thickness of 0.7 mm. Via holes each having a diameter of 0.2 mm were formed in the peripheral portion of the package substrate except for the central portion (25 mm×25 mm), and a copper paste was filled in the via holes. Then a copper thick wiring film was printed on the upper surface of the package substrate as shown in FIG. 5B. In addition, pads each having a diameter of 0.9 mm were formed on the lower surface of the package substrate by using a copper paste, and the package substrae was sintered at 900° C. Thereafter, a semiconductor element having dimensions of 8 mm×8 mm×0.3 mm was mounted on the copper thick wiring film at the central portion of the package substrate by using a silver-epoxy resin, and solder bumps and heat-transfer members each having a diameter of 0.9 mm were joined onto the pads to form a BGA type package shown in FIG. 5B.

When the electric resistance and thermal resistance of the obtained BGA type package sample were measured, the electric resistance was 0.5Ω and the thermal resistance was 8.2° C./W.

(Sample 2)

The operation for Sample 1 was repeated, excepting that aluminum nitride powder was used in place of a silicon nitride powder and that the sintering temperature of the green sheet was changed to 1,800° C., to form a BGA package and measure an electric resistance and a thermal resistance. As a result, the electric resistance was 0.5Ω, and the thermal resistance was 7.5° C./W.

(Sample 3)

Aluminum nitride powder was compressed into a plate-like shape to form a green sheet, and via holes each having a diameter of 0.2 mm were formed in the peripheral portion of the green sheet except for the central portion (25 mm×25 mm). A tungsten paste was filled in the via holes, and pads each having a diameter of 0.9 mm were formed on the lower surface of the green sheet by using a tungsten paste. Thereafter, the green sheet was sintered at 1,800° C. to obtain a package substrate having dimensions of 35 mm×35 mm and a thickness of 0.7 mm. A copper thick wiring film was printed on the upper surface of the package substrate as shown in FIG. 5B. In addition, a semiconductor element having dimensions of 8 mm×8 mm×0.3 mm was mounted on the copper thick wiring film at the central portion of the package substrate by using a silver-epoxy resin, and solder bumps and heat-transfer members each having a diameter of 0.9 mm were joined onto the pads to form a BGA type package shown in FIG. 5B. When the electric resistance and thermal resistance of the obtained BGA type package were measured, the electric resistance was 0.5Ω and the thermal resistance was 7.5° C./W.

(Sample 4)

Aluminum nitride powder was compressed into a plate-like shape to form a green sheet, and via holes each having a diameter of 0.2 mm were formed in the peripheral portion of the green sheet except for the central portion (25 mm×25 mm). Next, a tungsten paste was filled in the via holes. Wires were printed on the upper surface of the green sheet by using a tungsten paste, and pads each having a diameter of 0.9 mm was formed on the lower surface of the green sheet by using a tungsten paste. Thereafter, the green sheet was sintered at 1,800° C. to obtain a package substrate having dimensions of 35 mm×35 mm and a thickness of 0.7 mm. In addition, a semiconductor element having dimensions of 8 mm×8 mm×0.3 mm was mounted on a copper thick wiring film at the central portion of the package substrate by using a silver-epoxy resin, and solder bumps and heat-transfer members each having a diameter of 0.9 mm were joined onto the pads to form a BGA type package shown in FIG. 5B. When the electric resistance and thermal resistance of the obtained BGA type package were measured, the electric resistance was 1.5Ω and the thermal resistance was 7.6° C./W. This value of electric resistance corresponds to a value which is about three times those of the above Sample 1 to 3.

It must be understood that the invention is in no way limited to the above embodiments and that many changes may be brought about therein without departing from the scope of the invention as defined by the appended claims.

What is claimed is:

1. A semiconductor package comprising:

a semiconductor chip;

a package substrate composed of ceramic on which the semiconductor chip is mounted;

a wire formed on the package substrate and connected to the semiconductor chip; and an electric connection member formed on the package substrate to electrically connect the wire to a printed board when the package substrate is mounted on the printed board, wherein one surface of the package substrate has a first area in which the semiconductor chip is mounted and a second area in which the wire is arranged, and the other surface of the package substrate has a third area which is located in the rear of the second area and in which the electric connection member connects the wire to the printed board and a fourth area which is located in the rear of the first area, and wherein the fourth area has neither a wire nor an electric connection for connecting the package substrate and the printed board, the package substrate between the first area and the fourth area has no inner wire, and a heat-transfer member for transmitting heat generated by the semiconductor chip to the printed board through the package substrate is mounted on said other surface of the package substrate in the fourth area.

2. The semiconductor package of claim 1, wherein the heat-transfer member is electrically disconnected from the semiconductor chip and the wire.

3. A semiconductor device produced by mounting the semiconductor package of claim 2, on the printed board.

4. The semiconductor package of claim 1, wherein the heat-transfer member includes a plurality of spherical balls which are made of a low-melting-point alloy.

5. The semiconductor package of claim 4, wherein the low-melting-point alloy is selected from the group consisting of tin-lead alloy, tin-zinc alloy, tin-silver alloy, tin-copper alloy and tin-bithmus alloy.

6. A semiconductor device produced by mounting the semiconductor package of claim 4, on the printed board.

7. The semiconductor package of claim 1, wherein the electric connection member includes a bump which is formed in the third area on the other surface of the package substrate and a via which penetrates the package substrate to connect the wire and the bump.

8. The semiconductor package of claim 7, wherein the bump includes a spherical ball which is made of a low-melting-point alloy.

9. The semiconductor package of claim 8, wherein the low-melting-point alloy is selected from the group consisting of tin-lead alloy, tin-zinc alloy, tin-silver alloy, tin-copper alloy and tin-bithmus alloy.

10. The semiconductor package of claim 7, wherein the via is formed of copper.

11. The semiconductor package of claim 1, wherein the package substrate is composed of a material which is selected from the group consisting of aluminum nitride and silicon nitride.

12. A semiconductor device produced by mounting the semiconductor package of claim 11, on the printed board.

13. The semiconductor package of claim 1, wherein the package substrate is a single-layer ceramic substrate.

14. The semiconductor package of claim 1, wherein the wire is formed by using copper.

15. The semiconductor package of claim 1, wherein the wire has a pattern layer which is formed of tungsten and a plate layer which laminated on the pattern layer, and the plate layer is formed of a material which is selected from the group consisting of gold and copper.

16. The semiconductor package of claim 1, wherein the wire further has a layer which contains nickel.

17. The semiconductor package of claim 1, wherein the wire and the semiconductor chip are connected by a bonding wire, and the semiconductor chip and the bonding wire are sealed with a resin.

18. The semiconductor package of claim 1, wherein the wire and the semiconductor chip are connected by means of flip-chip connection using a bump, and the flip-chip connection is sealed with a resin.

19. The semiconductor package of claim 1, wherein the semiconductor chip includes a circuit element which is operated with high frequency signal.

20. A semiconductor device produced by mounting the semiconductor package of claim 1, on the printed board.

* * * * *